(12) United States Patent
Belge et al.

(10) Patent No.: US 7,786,737 B2
(45) Date of Patent: Aug. 31, 2010

(54) MODELING AND CALIBRATING A THREE-PORT TIME-DOMAIN REFLECTOMETRY SYSTEM

(75) Inventors: Murat Belge, Billerica, MA (US); Christopher C. Cunningham, Brighton, MA (US)

(73) Assignee: Aware, Inc., Bedford, MA (US)

( * ) Notice: Subject to any disclaimer, the term of this patent is extended or adjusted under 35 U.S.C. 154(b) by 0 days.

(21) Appl. No.: 12/411,127

(22) Filed: Mar. 25, 2009

(65) Prior Publication Data

US 2009/0182519 A1    Jul. 16, 2009

Related U.S. Application Data

(63) Continuation of application No. 11/683,269, filed on Mar. 7, 2007, now Pat. No. 7,521,938, which is a continuation of application No. 11/534,864, filed on Sep. 25, 2006, now abandoned, which is a continuation of application No. 10/975,441, filed on Oct. 29, 2004, now abandoned, which is a continuation of application No. 10/289,286, filed on Nov. 7, 2002, now Pat. No. 6,842,012.

(60) Provisional application No. 60/344,927, filed on Nov. 7, 2001.

(51) Int. Cl.
*G01R 35/00* (2006.01)
*G01R 27/32* (2006.01)

(52) U.S. Cl. ........................... 324/601; 324/637

(58) Field of Classification Search ........... 324/601, 324/637
See application file for complete search history.

(56) References Cited

U.S. PATENT DOCUMENTS 4,904,927 A    2/1990    Garbe et al.

(Continued)

FOREIGN PATENT DOCUMENTS

EP    1111808    6/2001

OTHER PUBLICATIONS

David M. Pozar, "Microwave Engineering", 1998, second edition; 4.2 Impedance and Admittance Matrices, pp. 191-193.

(Continued)

*Primary Examiner*—Amy He
(74) *Attorney, Agent, or Firm*—Jason H. Vick; Sheridan Ross, P.C.

(57) ABSTRACT

A three-port TDR front end comprises numerous components. An exemplary three-port TDR front end is a DSL modem. Information-bearing TDR signals are distorted as they pass through these components. With a perfect model of the response of its front-end, a TDR system usually can compensate for the effects of its front-end. In reality, however, the electrical characteristics of each component vary from design-to-design, board-to-board, and slowly over time The result is imperfect knowledge about the true response of the front-end, errors in the model of the front-end, and degraded TDR performance. At least for this reason it is important to precisely calibrate the response of the TDR front-end through the use of a TDR modeling system.

22 Claims, 8 Drawing Sheets

U.S. PATENT DOCUMENTS

| | | | |
|---|---|---|---|
| 5,557,267 A * | 9/1996 | Poduje et al. | 340/870.04 |
| 5,698,984 A * | 12/1997 | Little et al. | 324/601 |
| 5,751,153 A | 5/1998 | Bockelman | |
| 6,252,900 B1 | 6/2001 | Liu et al. | |
| 6,534,996 B1 | 3/2003 | Amrany et al. | |
| 6,653,848 B2 | 11/2003 | Adamian et al. | |
| 6,658,052 B2 | 12/2003 | Krinsky et al. | |
| 6,744,262 B2 | 6/2004 | Adamian | |
| 6,778,596 B1 | 8/2004 | Tzannes | |
| 6,842,012 B2 * | 1/2005 | Belge et al. | 324/637 |
| 6,934,655 B2 | 8/2005 | Jones et al. | |
| 7,521,938 B2 | 4/2009 | Belge et al. | |
| 2002/0114383 A1 | 8/2002 | Belge et al. | |
| 2005/0060136 A1 | 3/2005 | Belge et al. | |
| 2007/0030015 A1 | 2/2007 | Belge et al. | |

OTHER PUBLICATIONS

Gilbert Strange, "Linear ALgebra and Its Applications", 1986, third edition; pp. 154-156.

International Preliminary Examination Report for International (PCT) Patent Application No. PCT/US02/35660, mailed Jul. 15, 2003.

PCT International Search Report dated Apr. 7, 2003 (PCT/US02/35660).

Office Action for U.S. Appl. No. 11/683,269, mailed Dec. 18, 2007.

Notice of Allowance for U.S. Appl. No. 11/683,269, mailed Feb. 2, 2009.

* cited by examiner

MODELING AND CALIBRATING A THREE-PORT TIME-DOMAIN REFLECTOMETRY SYSTEM

RELATED APPLICATION DATA

This application is a Continuation of U.S. Application No. 11/683,269 filed Mar. 7, 2007, now U.S. Pat. No. 7,521,938, which is a Continuation of U.S. application No. 11/534,864 filed Sep. 25, 2006 now abandoned, which is a Continuation of U.S. application No. 10/975,441 filed Oct. 29, 2004 now abandoned, which is a Continuation of U.S. application No. 10/289,286 filed Nov. 7, 2002, now U.S. Pat. No. 6,842,012, which claims the benefit of and priority under 35 U.S.C. §119(e) to U.S. patent application Ser. No. 60/344,927, filed Nov. 7, 2001, entitled "A Method for the Determination of the System Parameters of an Echo Measurement System," each of which are incorporated herein by reference in their entirety.

BACKGROUND OF THE INVENTION

1. Field of the Invention

This invention generally relates to time-domain reflectometry. In particular, this invention relates to systems and methods for calibrating a time-domain reflectometer to precisely determine the reflectometer's response when connected to an electrical network.

2. Description of Related Art

Time-domain reflectometry (TDR) systems use electrical measurements to estimate the physical structure and electrical nature of a conducting medium, which will be referred to herein as the Device Under Test (DUT). An example of a DUT is a twisted pair subscriber line, which comprises one or more interconnected electrical transmission lines generally having unknown terminations. Features of the DUT that can be estimated include the length of the line, the existence of bridged taps, the bridged tap locations, the bridged tap lengths, changes in gauge, terminations, and the like. Exemplary DUTs, such as subscriber lines, are constructed of twisted pairs, which distort the amplitude and phase of electrical waveforms that propagate through the line. Since, the amplitude of the waveforms decrease exponentially with travel distance, the waveforms received from long subscriber lines are extremely weak and require a precise TDR system to capture minute variations that contain information about the characteristics of the subscriber line.

SUMMARY OF THE INVENTION

Identifying, measurizing and characterizing the condition of a transmission line is a key element of any Digital Subscriber Line (DSL) deployment. In cases where the transceiver connection is not performing as expected, for example, the data rate is low, there are many bit errors, a data link is not possible, or the like, it is important to be able to identify characteristics about the loop including the length of the loop, and the existence, location and length of any bridged taps without having to send a technician to a remote modem site to run diagnostic tests. In these cases a TDR system can be used to measure and characterize the transmission line in order to determine the problem with the connection. It is particularly desirable to implement the TDR system in the DSL transceiver that is already connected to the transmission line. This allows the DSL service provider to determine transmission faults without physically disconnecting the telephone line from the DSL transceiver, thus effectively converting the DSL. transceiver into a TDR system.

The TDR system discussed herein includes a three-port network, which will be referred to herein as the "front-end." The TDR front-end is used to transmit signals and receive the corresponding reflected signals to obtain info-nation about the characteristics of the DUT. As discussed above, one exemplary implementation of such a three-port device is the front-end of a DSL. transceiver.

A TDR front-end comprises numerous components. An artifact of these components is that information-bearing TDR signals are distorted as they pass through these components. With a perfect model of the response of the front-end, a TDR system can usually compensate for the artifacts introduced by the front-end components. In reality, however, the electrical characteristics of each component vary from design-to-design, board-to-board, slowly over time, and based on temperature. This is especially an issue when the TDR system is implemented in a DSL transceiver utilizing the DSL transceiver front-end. Since the DSL transceiver must also operate as a regular information transmission device, the transceiver is designed using different design criteria than a dedicated TDR system. For example, DSL transceivers are consumer devices that are produced in large volume at low cost and therefore the components used may not be as high a quality as dedicated TDR systems. The result is imperfect knowledge about the true response of the front-end, errors in the model of the front-end and degraded TDR performance.

For at least this reason, it is important to precisely characterize the response of the TDR front-end. In particular, a front-end calibration method is required to determine the exact characteristics of the TDR system thereby removing the uncertainty of the electrical characteristics of the components in the TDR front-end. Since the TDR system is a three port system the calibration method determines the three independent parameters that completely specify any three port system. In the calibration process, the TDR system is connected to at least three predetermined DUTs and the TDR front-end is used to transmit signals and receive the corresponding reflected signals with each DUT connected. Next, the TDR system is calibrated by determining the three independent parameters of the three port TDR system using the transmitted and received waveforms along with the predetermined DUT characteristics.

As an example, the TDR system can be implemented in a DSL transceiver and the DUT that needs to be characterized can be the transmission line that is causing problems in the DSL connection, e.g., bit errors. In this case, it is necessary to first calibrate the DSL transceiver front-end to characterize the electrical characteristics of all its components. Therefore, the DSL transceiver is connected to three known impedances and the DSL transceiver front-end is used to transmit signals and receive the corresponding reflected signals with each impedance connected. Next, the front-end is calibrated by determining the three independent parameters of the DSL front-end using the transmitted and received waveforms along with the known impedance values. Then, for example, as discussed in co-pending application Ser. No. 09/755,173, entitled "Systems and Methods for Establishing a Diagnostic Transmission Mode and Communicating Over the Same," filed Jan. 8, 2001 and incorporated herein by reference in its entirety, one or more of the calibration information, characterization of the transmission line, or any other relevant information can be transmitted to a location, such as a central office modem.

Accordingly, the systems and methods of this invention at least provide and disclose a model of the TDR front-end and a method for determining the parameters of the model using experimental measurements.

Aspects of the invention also relate to a generalized model of the TDR front-end.

Aspects of the invention further relate to modeling the behavior of a composite system where an arbitrary DUT is connected to port three of the TDR system.

Aspects of the invention also relate to calibrating the TDR front-end model.

Furthermore, aspects of the invention further relate to determining the TDR front-end model parameters.

These and other features and advantages of this invention are described in, or apparent from, the following detailed description of the embodiments.

BRIEF DESCRIPTION OF THE DRAWINGS

The embodiments of the invention will be described in detail, with reference to the following figures, wherein.

DETAILED DESCRIPTION OF THE INVENTION

The exemplary embodiments of this invention will be described in relation to the application of a model to describe the TDR front-end and a method for determining the parameters of the model. However, it should be appreciated, that in general, the systems and methods of this invention will work equally well for modeling any type of three port TDR system.

The exemplary systems and methods of this invention will also be described in relation to a TDR system that can be used in conjunction with a DUT such as a twisted-pair transmission line. However, to avoid unnecessarily obscuring the present invention, the following description omits well-known structures and devices that may be shown in block diagram form or otherwise summarized.

For the purposes of explanation, numerous details are set forth in order to provide a thorough understanding of the present invention. It should be appreciated however, that the present invention may be practiced in a variety of ways beyond these specific details. For example, the systems and methods of this invention can generally be applied to any type of transmission line.

Furthermore, while the exemplary embodiments illustrated herein show the various components of the TDR system collocated, it is to be appreciated that the various components of this system can be located at distant portions of a distributed network, such as a telecommunications network and/or the Internet, or within a dedicated TDR system. Thus, it should be appreciated that the components of the TDR system can be combined into one or more devices, such as a DSL transceiver, or collocated on a particular node of a distributed network, such as a telecommunications network. As will be appreciated from the following description, and for reasons of computational efficiency, the components of the TDR system can be arranged at any location within a distributed network without affecting the operation of the system. For example, the various components can be located in a CO modem, CPE modem, or some combination thereof.

Furthermore, it should be appreciated that the various links connecting the elements can be wired or wireless links, or any combination thereof or any other know or later developed element(s) that is capable of supplying and/or communicating data to and from the connected elements. Additionally, the term module as used herein can refer to any known or later developed hardware, software, or combination of hardware and software that is capable of performing the functionality associated with that element.

Figure 1:
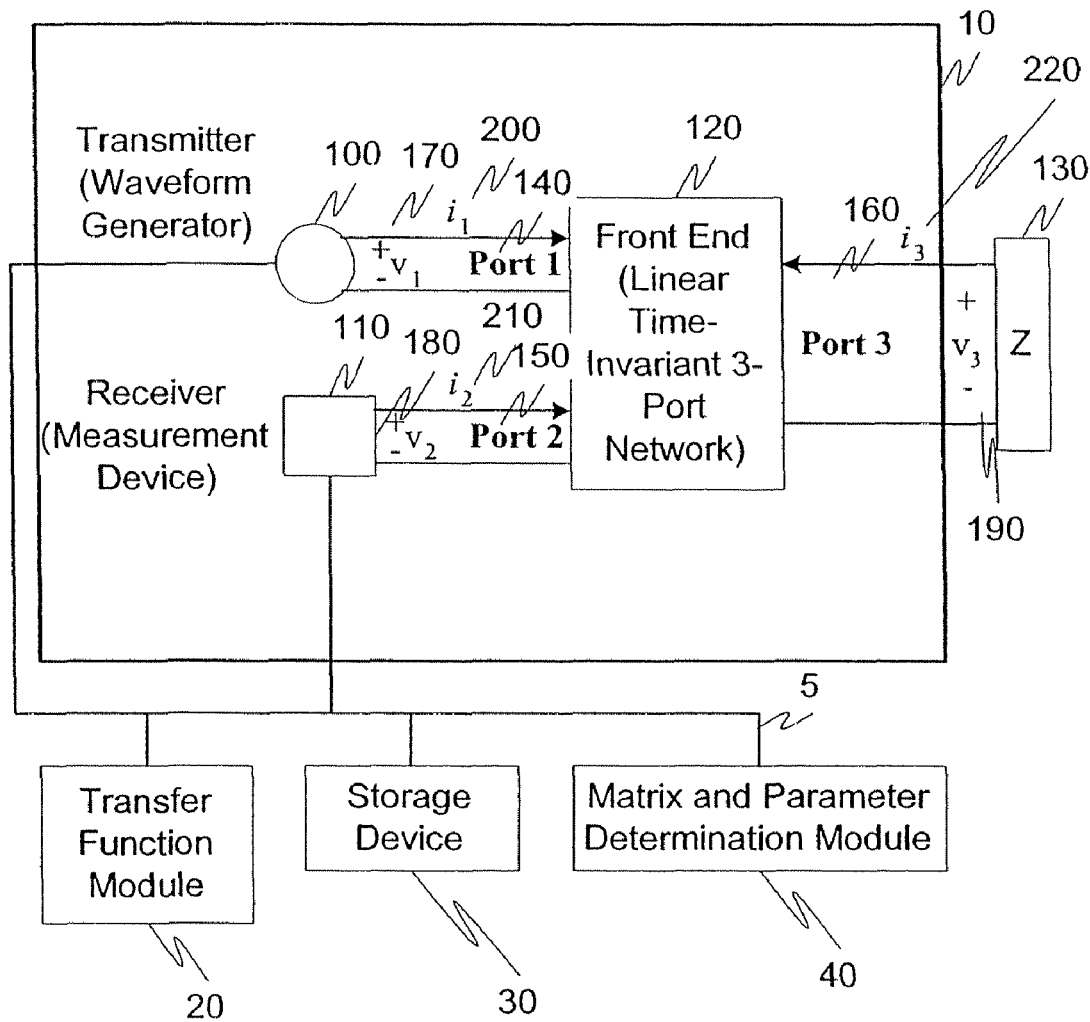
FIG. 1 is a functional block diagram illustrating an exemplary generalized model of a three port TDR front-end according to this invention.

FIG. 1 illustrates an exemplary generalized model of the TDR front-end. The TDR front-end can be modeled as a linear, time-invariant three-port electrical network. Specifically, as illustrated in FIG. 1, the TDR system 10 comprises a transmitter 100, a receiver 110, which may also include any necessary measurement components for measuring the received waveform as well processors and/or memory (not shown), a front-end 120, a device under test (DUT) 130, a first port 140, a second port 150, a third port 160, a first voltage ($v_1$) 170 corresponding to the voltage across the first port 140, a second voltage ($v_2$) 180 corresponding to a voltage across the second port, a third voltage ($v_3$) 190 corresponding to a voltage across the third port, a first current ($i_1$) 200, a second current ($i_2$) 210 and a third current ($i_3$) 220. In general, signals are transmitted from the transmitter 100, such as a digital-to-analog converter or other waveform generator, at port 1, reflections received by the receiver 110, such as an analog-to-digital converter or other measurement device, on port 2, with port 3 being connected to the DUT 130, such as a subscriber line or other one-port electrical network The TDR system 10 is also connected via link 5 to a transfer function module 20, a storage device 30 and a parameter and matrix determination module 50.

This three-port model of the front-end captures any linear, time-invariant implementation that may be present within the front-end, including, but not limited to, transmit path filtering inside port 1, receive path filtering inside port 2, hybrid circuitry connecting the ports, output filtering inside port 3, echo cancellers, or the like. Exemplary TDR front-ends that are characterized by the three-port model of the front-end include a wired or wireless modem, a DSL modem, an ADSL modem, a multicarrier transceiver, a VDSL modem, an SHDSL modem, and the like.

Figure 2:
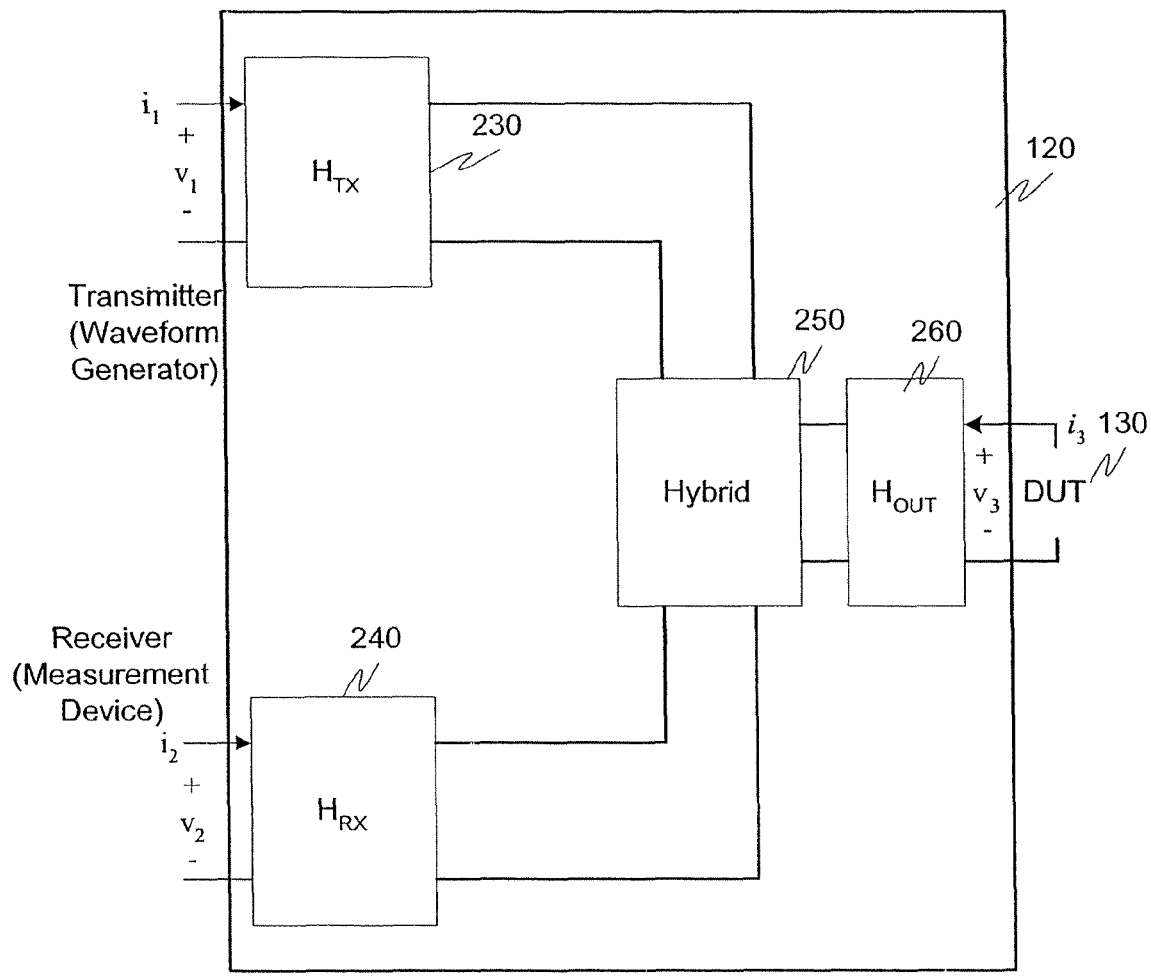
FIG. 2 is a functional block diagram illustrating an exemplary three-port TDR front-end model according to this invention.

FIG. 2 illustrates an exemplary configuration within the three-port TDR front-end model 120. For this exemplary implementation, the front-end model 120 comprises a transmit path filter 230, a receive path filter 240, an analog hybrid circuit 250 and an output filter 260.

However, regardless of the specific implementation inside the front-end model, any linear time-invariant three-port network can be described by the matrix equation u=Yw, where $$Y = \begin{pmatrix} y_{11} & y_{12} & y_{13} \\ y_{21} & y_{22} & y_{23} \\ y_{31} & y_{32} & y_{33} \end{pmatrix}$$

is an admittance matrix describing the relationships between currents and voltages of each port, and $$u = \begin{pmatrix} i_1 \\ i_2 \\ i_3 \end{pmatrix}$$

and $$w = \begin{pmatrix} v_1 \\ v_2 \\ v_3 \end{pmatrix}$$

are vectors containing the currents and voltages, respectively, at each port. Further details regarding the vector relationship can be found in *Microwave Engineering*, Second Edition, by D. M. Pozar, Wiley, New York, 1998, which is incorporated hereby by reference in its entirety, and in particular pp. 191-193.

In general, each of the quantities $y_{ij}$ are a complex function of frequency. Explicit notation of frequency dependence has been omitted for clarity. Therefore, it should be assumed that all parameters are complex functions of frequency unless noted otherwise.

The DUT typically comprises one or more interconnected electrical transmission lines with unknown terminations. More generally, the DUT may be any linear, time-invariant, one-port electrical network. An exemplary DUT is a subscriber line.

Figure 3:
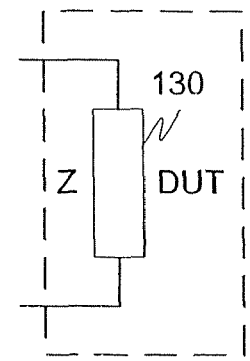
FIG. 3 illustrates a first exemplary method of characterizing a DUT according to this invention.
Figure 4:
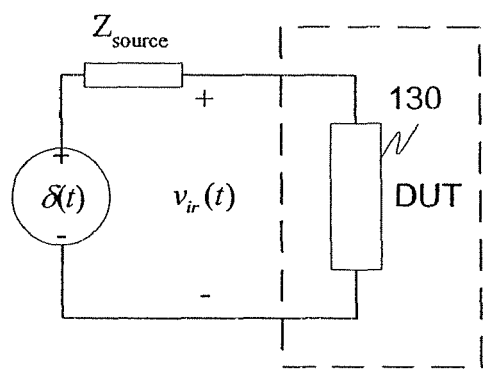
FIG. 4 illustrates a second exemplary method of characterizing a DUT according to this invention.
Figure 5:
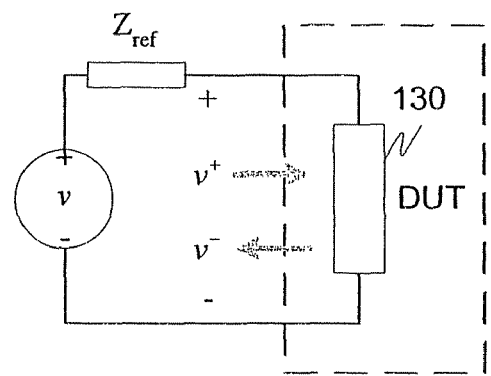
FIG. 5 illustrates a third exemplary method of characterizing a DUT according to this invention.

There are several exemplary ways to completely characterize the DUT including, for example:

1) As a complex, frequency-dependent input impedance Z, as shown in FIG. 3. The input impedance includes all aspects of the DUT 130 and is not just limited to the characteristic impedance of the first section.
2) As a voltage impulse response $v_{ir}(t)$, also denoted h(t), when connected to a voltage source with source impedance $Z_{source}$ as shown in FIG. 4, where $\delta(t)$ is an impulse voltage waveform.
3) As a complex, frequency-dependent one-port scattering parameter $S_{11}$ with respect to reference impedance $Z_{ref}$ as shown in FIG. 5, where $v^+$ is the forward-traveling voltage wave, $v^-$ is the backward-traveling voltage wave and $$S_{11} = \frac{v^-}{v^+}.$$

However, it is to be appreciated that while only three exemplary methods of characterizing a DUT are enumerated, there are an infinite number of ways to completely characterize a DUT. Each representation provides the same amount of information about the DUT such that each characterization is fundamentally equivalent. Therefore, changing the representation of the DUT does not change the behavior of the DUT, the representation merely changes the description of how the DUT behaves.

Each of the various representations can be mapped to one another using transformations. For example, if the DUT is described by its voltage impulse response h(t), then it is related to input impedance Z of the DUT in accordance with:

$$h(t) = \frac{Z}{Z_{source} + Z}.$$

Similarly if the DUT is described by its complex, frequency-dependent one-port scattering parameter $S_{11}$, then it is related to the input impedance Z of the DUT in accordance with:

$$S_{11} = \frac{Z - Z_{ref}}{Z + Z_{ref}}.$$

For ease of understanding, the remaining disclosure will use the complex, frequency-dependent input impedance Z to describe the DUT. However, it should be appreciated, that any other equivalent representation can be substituted without changing the underlying behavior of the model.

Specifically, the system attempts to model the behavior of the composite system when an arbitrary DUT is connected to port 3 of the TDR system 10. The behavior of the system is described by the response at the receiver port 2 150 to a stimulus at transmitter port 1 140. Either voltage or current can be applied at port 2 140, and either voltage or current can be measured at port 2 150. Therefore, there are at least four possible ways to obtain the system transfer function. However, it should be appreciated, that the system transfer function is but one or many equivalent ways to completely characterize the system. Any of these four methods provides the same information about the system, the choice of using one method over another depends, for example, on which one is more efficient to implement.

As an example, voltages can be used at port 1 and port 2 so the voltage transfer function for the system is $$H = \frac{v_2}{v_1},$$

which is a complex function of frequency. It should be appreciated however, that the models for each of the other three possible implementations are equivalent, so the analysis presented below applies equally to each.

It can be assumed that the voltage is measured at port 3 160 using a device with infinite impedance, which yields $i_2=0$. If the voltage measurement device at port 3 160 were not to have an infinite input impedance, then its finite input impedance could be absorbed into the three-port network. Therefore, there is no loss in generality by assuming that $i_2=0$.

The voltage transfer function of the TDR system is given by $$H = \frac{aZ + b}{cZ + 1} \quad (1)$$

where a, b and c are complex functions of frequency. Relating a, b, and c to $y_{ij}$, $$a = \frac{y_{23} y_{31} - y_{21} y_{33}}{y_{22}},$$

$$b = -\frac{y_{21}}{y_{22}},$$

$$c = \frac{y_{22} y_{33} - y_{23} y_{32}}{y_{22}}.$$

Therefore, the three-port TDR front-end can be completely characterized by three independent parameters. Like the DUT, these three TDR front-end parameters can be represented in many different ways. For example, a, b, and c can be mapped to an alternative set of parameters as follows:

$$\tilde{a} = \frac{aZ_{ref} - b}{cZ_{ref} + 1},$$

$$\tilde{b} = \frac{aZ_{ref} + b}{cZ_{ref} + 1},$$

$$\tilde{c} = \frac{cZ_{ref} - 1}{cZ_{ref} + 1}.$$

This allows H to be expressed as a function of $S_{11}$ for the DUT as follows:

$$H = \frac{\tilde{a}S_{11} + \tilde{b}}{\tilde{c}S_{11} + 1}.$$

Again, there are an infinite number of ways to completely characterize the three TDR front-end parameters. Each representation provides the same amount of information about the TDR front-end, so they are fundamentally equivalent.

However, it should be noted that the system could be completely characterized by more than three parameters. Nevertheless, any representation that uses more than three parameters can be reduced to three independent parameters by the appropriate mapping. For example, $$H = \frac{a'Z + b'}{c'Z + d'}$$

can be reduced to the three independent parameters of Eq. 1 using:

$$a = \frac{a'}{d'},$$

$$b = \frac{b'}{d'},$$

and $$c = \frac{c'}{d'}.$$

Another example is:

$$H = \frac{\hat{a}Z + \hat{b}}{\hat{c}Z + 1} + \hat{d}$$

which can be reduced to three independent parameters using $a = \hat{a} + \hat{c}\hat{d}, b = \hat{b} + \hat{d},$ and $c = \hat{c}$.

The transfer function H has been formulated in terms of a three-port electrical network and the DUT 130. Although the three-port representation is commonly used to characterize the loading effects of analog circuitry, the transfer function H may generally include the effects of digital signal processing. For example, digital filters and digital echo cancellers could be absorbed into the a, b, and c parameters. In this case, the transmitted signal $v_1$ is digital in nature and does not necessarily exist as a physical voltage, but eventually is converted to a voltage through a digital-to-analog converter (DAC). Similarly, the received digital signal corresponds to $v_2$, which at some point was converted from a physical voltage to a digital signal using, for example, an analog-to-digital converter (ADC).

As noted above, the models of the TDR front-end can be based on as few as three complex, frequency-dependent parameters. As discussed hereinafter, a technique for determining the value of these parameters based on actual measurements is illustrated. This technique will be referred to as "calibration."

The response of the front-end model must match the response of the actual front-end precisely enough to capture minute details of the waveforms that propagate through the actual front-end. Calibration is necessary since the electrical characteristics of the real front-end components can vary from design-to-design, and from board-to-board. Sometimes, component characteristics will vary slowly over time, which necessitates that the system be calibrated within a certain time period, for example during an initialization, before TDR measurements are performed on the DUT.

As an example, the system could be calibrated by measuring each component individually, and incorporating the actual values into a complex system model that takes into account the relationships between each component. In reality, however, this approach would be time-consuming and impractical because systems typically contain hundreds of components with complex relationships. The front-end of a typical DSL modem exemplifies a system with numerous components.

Using a model of the TDR front-end, such as the three-parameter model disclosed above, greatly simplifies the calibration process. The model allows a precise response of a front-end to be captured by taking far fewer measurements and combining them in a much simpler fashion.

Since the model of H contains three independent parameters that describe the TDR front-end, not including the parameter that characterizes the DUT, then at least three different measurements with different known DUTs are required to solve for each of the independent parameters.

If N measurements have been taken with N different DUTs, each with known impedance, then the TDR system transfer function can be determined for each of these N configurations. It is possible to determine values for a, b, and c that best fit Eq. 1 for the collection of all N configurations. The notion of "best fit" depends on the criterion chosen to quantify how well the measured values fit the data, such as minimizing some measure of error. One common criterion for establishing best fit is to minimize error in the least-squares sense. It should be noted however, that other optimization criteria are possible. If another optimization criterion is used, the underlying concept remains the same.

The following example demonstrates optimization of a, b, and c in the least-squares sense. Assume that N measurements have been taken. Let $Z_n$ and $H_n$ denote the DUT impedance and TDR system transfer function, respectively, obtained for measurement n. Rearranging Eq. 1, $aZ_n + b - cZ_nH_n = H_n$ for each n. This system of equations can be re-written in matrix form as Av=h where $$v = \begin{pmatrix} a \\ b \\ c \end{pmatrix}$$

contains the parameters to be determined and $$A = \begin{pmatrix} Z_1 & 1 & -Z_1 H_1 \\ Z_2 & 1 & -Z_2 H_2 \\ \vdots & \vdots & \vdots \\ Z_N & 1 & -Z_N H_N \end{pmatrix} \quad (2)$$

and $$h = \begin{pmatrix} H_1 \\ H_2 \\ \vdots \\ H_N \end{pmatrix}.$$

If N=3, the values of a, b and c can sometimes be obtained by solving $v=A^{-1}h$. In practice, however, measurement errors sometimes cause this system of equations to be inconsistent. If N>3, the system of equations is over-specified and is usually inconsistent.

Therefore, a solution for v can be found that minimizes some measure of the error. To minimize the error in the least-square sense, the optimal v, and thus the optimal a, b and c, can be found by satisfying the normal equations $A^{*T}Av_{opt}A^{*T}h$ where *T denotes transposition followed by complex conjugation. See G. Strange, *Linear Algebra and Its Application*, 3$^{rd}$ Ed., Harcourt Brace, San Diego, 1986, incorporated herein by reference in its entirety, and in particular pp. 154-156. It should be noted however, that other en-or minimization criterion are possible. If another error minimization is used, the underlying concept remains the same. This results in the following optimal value:

$$v_{opt} = [A^{*T}A]^{-1}A^{*T}h, \quad (3)$$

Because a, b, and c are frequency-dependent, this equation must be solved separately for each frequency of interest.

An exemplary technique for calibration according to this invention is accomplished with the aid of the transfer function module 20, the storage device 30 and the matrix and parameter determination module 40.

In particular, a DUT 130 of known impedance $Z_n$ is connected to port 3 160. The value of $Z_n$ should be known precisely and should be preferably chosen to maintain the front-end 120 within operational limits. A waveform $v_1$ is then generated and transmitted from the waveform generator 100 at port 1. The transmitted waveform is received as the returned waveform $v_2$ at port 2 150 and consequently at the receiver 110.

The transfer function module 20 determines the transfer function of the TDR system for the current DUT, i.e., DUT$_n$, in accordance with $$H_n = \frac{v_2}{v_1}$$

and stores the corresponding value pairs of $Z_n$ and $H_n$ in the storage device 30. This process is repeated for each n with the corresponding value pairs of $Z_n$ and $H_n$ being stored in the storage device 30.

Having the pairs of $Z_n$ and $H_n$, the matrix and parameter determination module 40 determines matrix A and vector h based on Eq. 2, as well as the parameters a, b, and c based on Eq. 3. The TDR system response H for any arbitrary DUT characterized by Z, can then be predicted by the transfer function module 20 based on the optimal parameters a, b, and c identified in Eq. 1.

Figure 6:
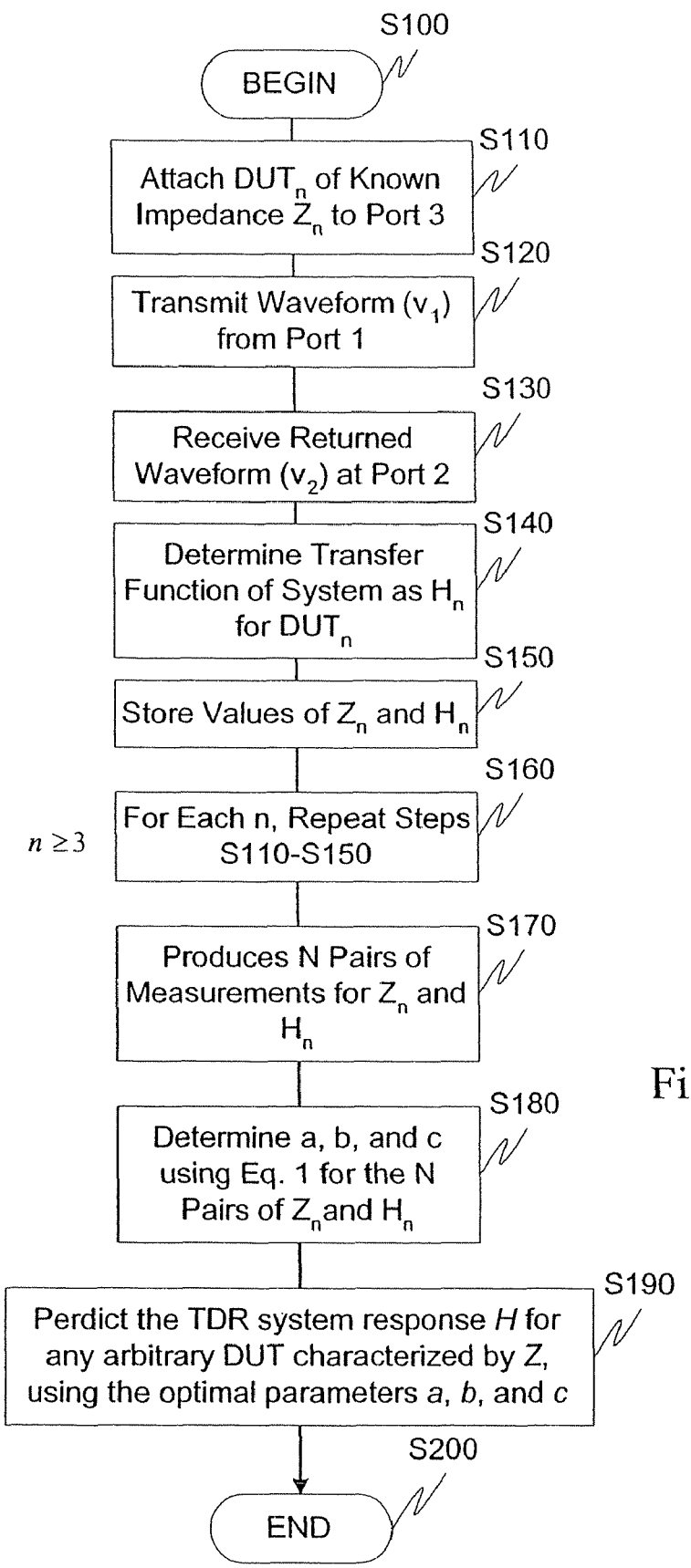
FIG. 6 is a flowchart illustrating an exemplary method of calibrating the TDR front-end model according to this invention.

FIG. 6 illustrates an exemplary technique for calibration according to this invention. In particular, control begins in step S100 and continues to step S 110. In step S110, a DUT of a known impedance is connected to port 3. The value of $Z_n$ should be known precisely. Ideally, $Z_n$ can be any value, but practical considerations dictate that care be taken to ensure that the front-end remains within its proper operating region. For example, port 3 should not be short-circuited if the short circuit would cause the front-end to exhibit non-linear behavior. The value of $Z_n$ can be complex and frequency-dependent, but usually a constant, real resistance is adequate.

Next, in step S120, a waveform $v_1$ is transmitted at port 1. Then, in step S130, the returned waveform is received as the returned waveform $v_2$ at port 2. The transmitted waveform $v_1$ should be chosen such that it adequately illuminates all frequencies for which the transfer function of the TDR system is to be determined, and it should also adhere to the sampling rate and dynamic range limitations of the front-end. Otherwise, any arbitrary $v_1$ can be used.

Furthermore, averaging can be performed to reduce uncorrelated background noise that might be present during each transmission. Control then continues to step S140.

In step S140, the transfer function of the TDR system is determined for the current DUT in accordance with $$H_n = \frac{v_2}{v_1}.$$

Only $v_1$ and $v_2$ are used in this calculation. $Z_1$, a, b, and c are not used.

Next, in step S150, the values of $Z_n$ and $H_n$ are recorded. Then, in accordance with step S160, for each n, steps S110-S150 are repeated. It should be ensured that $Z_n$ covers at least three distinct values. It is desirable to have a range of $Z_n$ that approximates many possible DUTs. When this step is complete, N pairs of measurements for $Z_n$ and $H_n$ will have been recorded, where N is the number of complex impedances used, and N≧3. Experiments have shown that results are improved by using more than three measurements, sometimes as many as ten (S170). Control then continues to step S180.

In step S180, the parameters a, b, and c are determined to best fit Eq. 1 for the collection of all N values of $Z_n$ and all N values of $H_n$. One exemplary method for determining a, b, and c, is to minimize error in the least-squares sense using Eq. 2 and Eq. 3. Then, in step S190, the TDR system response H for any arbitrary DUT characterized by Z, is predicted using the optimal parameters a, b, and c used in Eq. 1. Control then continues to step S200 where the control sequence ends.

Figure 7:
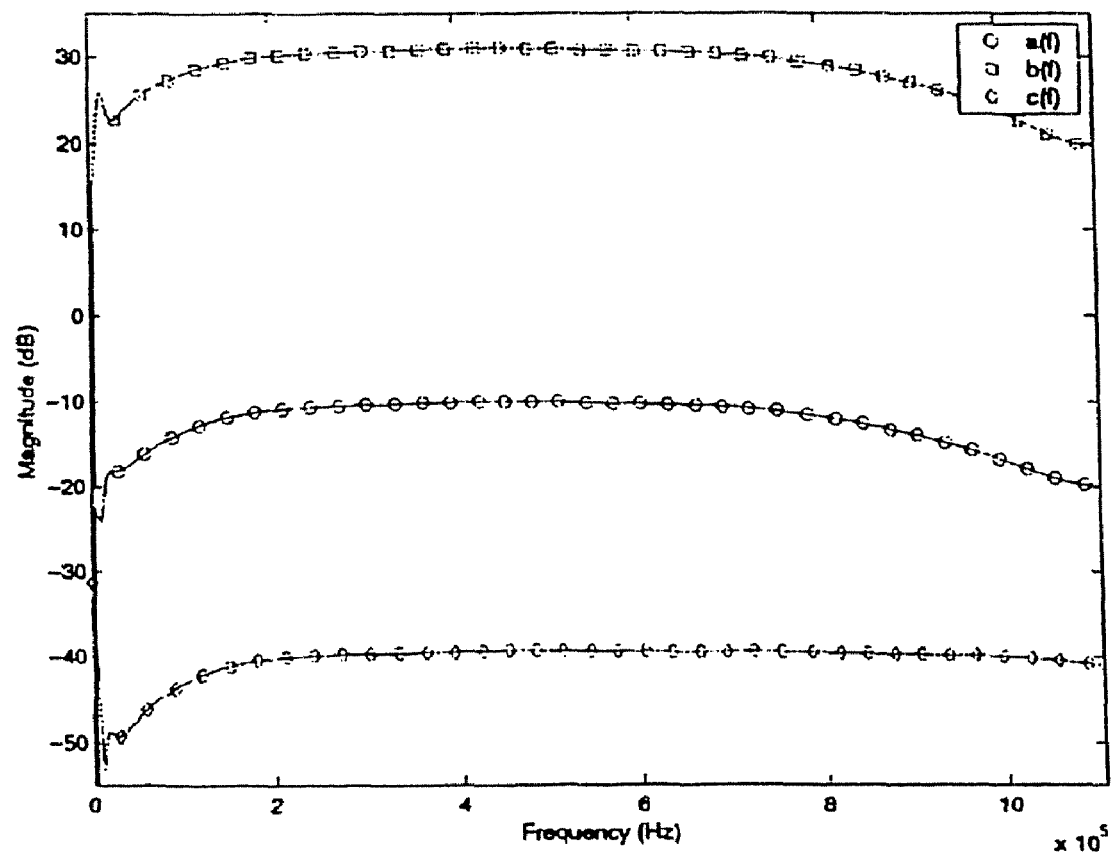
FIGS. 7-10 illustrate exemplary experimental results comparing the measured and predicted values.
Figure 8:
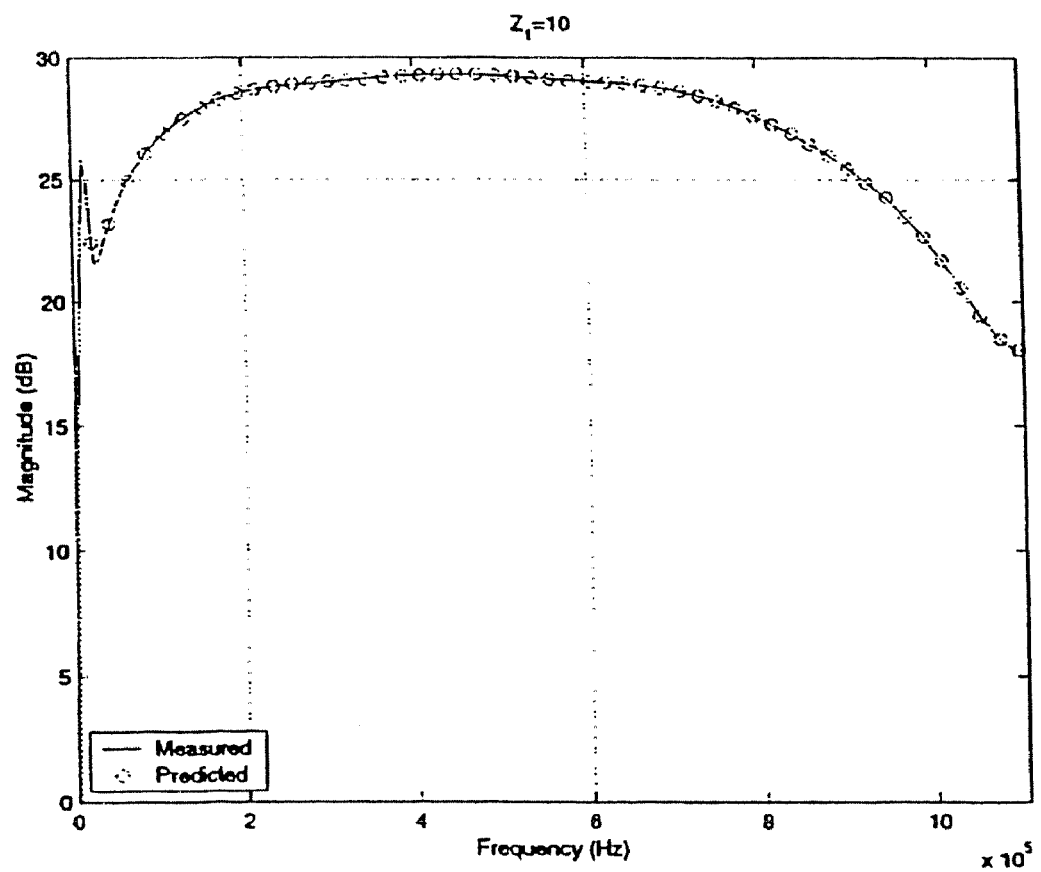
Figure 9:
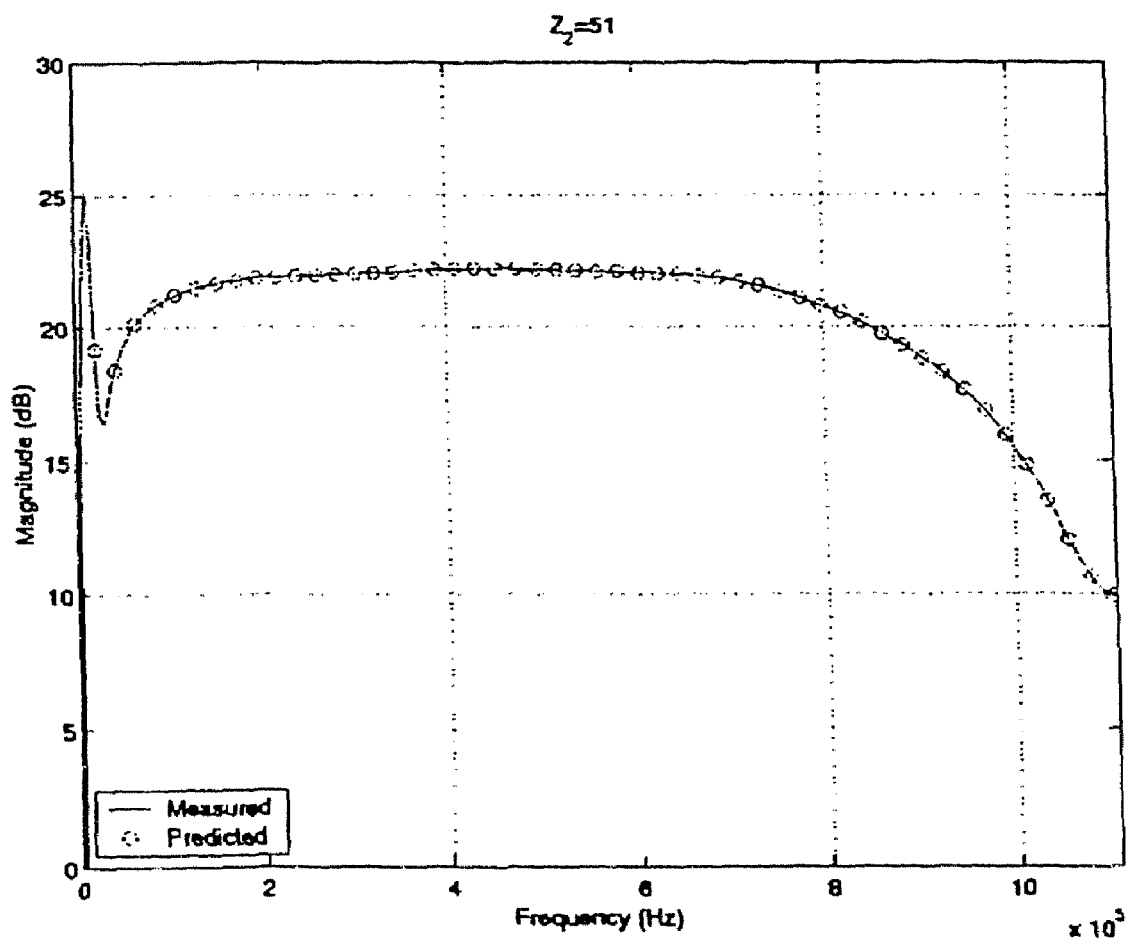
Figure 10:
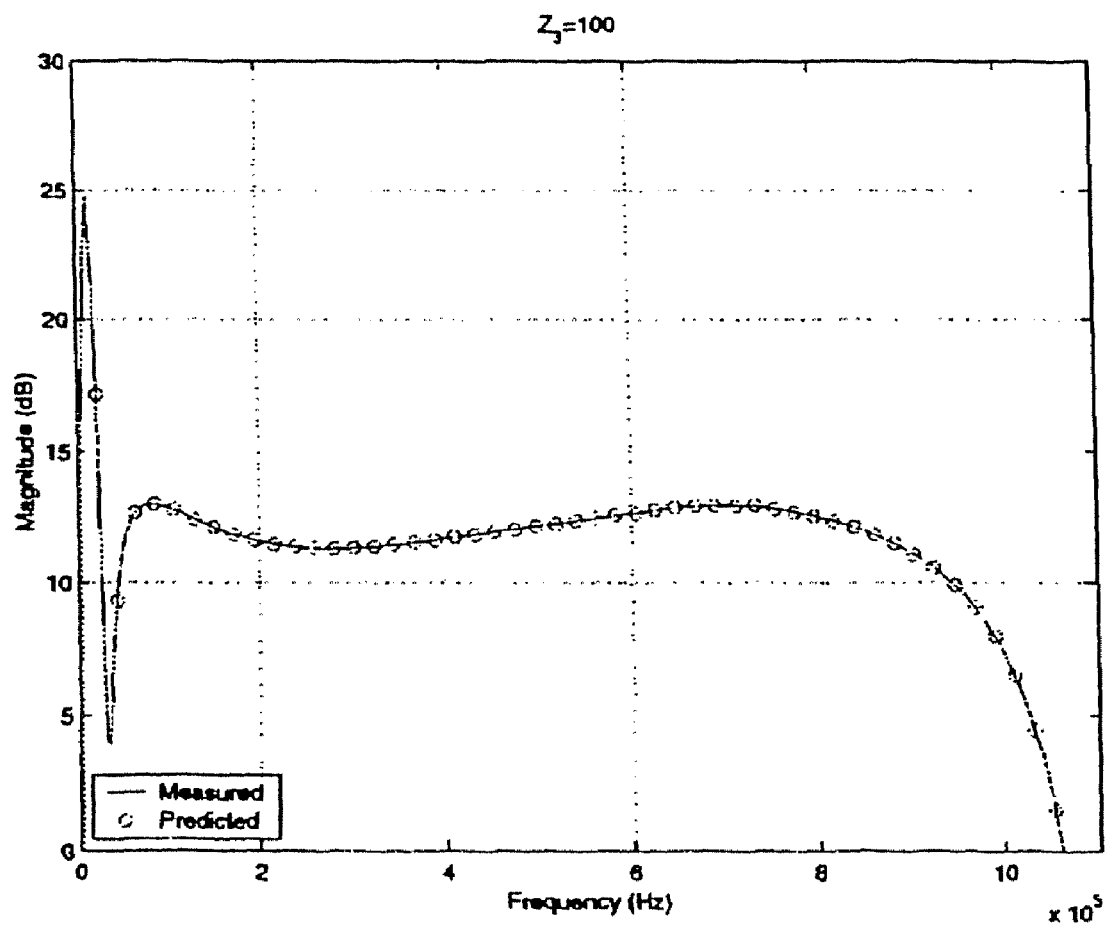

An experimental example of implementing the above calibration method was performed using a TDR system implemented on a DSL, transceiver. In particular, three measurements on a particular DSL, transceiver front-end were performed by connecting 10Ω, 51Ω, and 100Ω resistors to the DSL line interface port, i.e., port 3. $V_L(f)$ was obtained by sampling the analog voltage waveform at a rate of 2204 k samples per second, since this corresponds to the standard DSL transceiver sampling rate. The final measurement of the response of the DSL, front-end was obtained by dividing $V_L(f)$ into the input voltage waveform $V_s(f)$. The DSL front-end parameters a, b, and c were then determined in accordance with the above-described method. FIG. 7 shows the DSL front-end parameters obtained by solving Eq. 2. To test how well the given formulation can predict the actual echo responses, the measured and predicted echo responses were plotted in FIGS. 8-10. The predicted echo responses were obtained by plugging in the determined DSL front-end parameters a, b, and c into Eq. 1 for Z=10Ω, 51Ω, and 100Ω. As observed, the exemplary measured and predicted echo responses very closely approximate each other confirming the model for the DSL, front-end and validating that the approach of calibrating the transceiver by determining the parameters a, b, and c via experimental measurements is accurate.

The above-described TDR modeling system can be implemented on a telecommunications device, such a modem, a DSL modem, an SHDSL modem, an ADSL modem, a multicarrier transceiver, a VDSL modem, or the like, or on a separate programmed general purpose computer having a communications device. Additionally, the systems and methods of this invention can be implemented on a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device such as PLD, PLA, FPGA, PAL, modem, transmitter/receiver, or the like. In general, any device capable of implementing a state machine that is in turn capable of implementing the flowchart illustrated herein can be used to implement the various TDR modeling methods according to this invention.

Furthermore, the disclosed methods may be readily implemented in software using object or object-oriented software development environments that provide portable source code that can be used on a variety of computer or workstation platforms. Alternatively, the disclosed TDR modeling system may be implemented partially or fully in hardware using standard logic circuits or VLSI design. Whether software or hardware is used to implement the systems in accordance with this invention is dependent on the speed and/or efficiency requirements of the system, the particular function, and the particular software or hardware systems or microprocessor or microcomputer systems being utilized. The TDR modeling systems and methods illustrated herein however can be readily implemented in hardware and/or software using any known or later developed systems or structures, devices and/or software by those of ordinary skill in the applicable art from the functional description provided herein and with a general basic knowledge of the computer and telecommunications arts.

Moreover, the disclosed methods may be readily implemented in software executed on programmed general purpose computer, a special purpose computer, a microprocessor, or the like. In these instances, the systems and methods of this invention can be implemented as program embedded on personal computer such as JAVA® or CGI script, as a resource residing on a server or graphics workstation, as a routine embedded in a dedicated TDR modeling system, or the like. The TDR modeling system can also be implemented by physically incorporating the system and method into a software and/or hardware system, such as the hardware and software systems of a communications transceiver.

It is, therefore, apparent that there has been provided, in accordance with the present invention, systems and methods for TDR modeling. While this invention has been described in conjunction with a number of embodiments, it is evident that many alternatives, modifications and variations would be or are apparent to those of ordinary skill in the applicable arts. Accordingly, it is intended to embrace all such alternatives, modifications, equivalents and variations that are within the spirit and scope of this invention.

We claim:

1. A method of calibrating a DSL transceiver front-end for operation as a TDR system, the method comprising:
   connecting a first predetermined impedance to the DSL transceiver front-end;
   transmitting a first waveform and receiving a first echo response of the first waveform in the DSL transceiver;
   connecting a second predetermined impedance to the DSL transceiver front-end;
   transmitting a second waveform and receiving a second echo response of the second waveform in the DSL transceiver;
   connecting a third predetermined impedance to the DSL transceiver front-end;
   transmitting a third waveform and receiving a third echo response of the third waveform in the DSL transceiver;
   determining three independent parameters that characterize the DSL transceiver front-end;
   connecting the DSL transceiver to a transmission line; and
   determining a length of the transmission line using the three independent parameters.

2. The method of claim 1, wherein the three predetermined impedances are each a different value.

3. The method of claim 1, further comprising:
   connecting additional predetermined impedances to the DSL transceiver front-end; and
   transmitting a waveform and receiving an echo response in the DSL transceiver for each of the additional predetermined impedances.

4. The method of claim 1, wherein the first, second and third waveforms are the same waveform.

5. The method of claim 1, wherein the first, second and third waveforms are different waveforms.

6. The method of claim 1, further comprising determining a location of a bridged tap.

7. The method of claim 1, further comprising determining a length of a bridged tap.

8. The method of claim 1, wherein length the determining step is performed after the transceiver is not performing as expected.

9. The method of claim 1, wherein the length determining step is performed when the DSL transceiver data rate is low.

10. The method of claim 1, wherein the length determining step is performed when a data link is not possible.

11. The method of claim 1, wherein the length determining step is performed when the DSL transceiver has too many bit errors.

12. A system to calibrate a DSL transceiver front-end for operation as a TDR system comprising:
   a DSL transceiver capable of:
      transmitting a first waveform and receiving a first echo response of the first waveform in the DSL transceiver when a first predetermined impedance is connected to the DSL transceiver front-end;
      transmitting a second waveform and receiving a second echo response of the second waveform in the DSL transceiver when a second predetermined impedance is connected to the DSL transceiver front-end;

transmitting a third waveform and receiving a third echo response of the third waveform in the DSL transceiver when a third predetermined impedance is connected to the DSL transceiver front-end; and a parameter determination module capable of determining three independent parameters that characterize the DSL transceiver front-end, wherein the DSL transceiver is connected to a transmission line and a length of the transmission line is determined using the three independent parameters.

13. The system of claim 12, wherein the three predetermined impedances are each a different value.

14. The system of claim 12, wherein additional predetermined impedances are connected to the DSL transceiver front-end and a waveform transmitted and an echo response received in the DSL transceiver for each of the additional predetermined impedances.

15. The system of claim 12, wherein the first, second and third waveforms are the same waveform.

16. The system of claim 12, wherein the first, second and third waveforms are different waveforms.

17. The system of claim 12, wherein the DSL transceiver determines a location of a bridged tap.

18. The system of claim 12, wherein the DSL transceiver determines a length of a bridged tap.

19. The system of claim 12, wherein length the determining is performed after the transceiver is not performing as expected.

20. The system of claim 12, wherein the length determining step is performed when the DSL transceiver data rate is low.

21. The system of claim 12, wherein the length determining step is performed when a data link is not possible.

22. The system of claim 12, wherein the length determining step is performed when the DSL transceiver has too many bit errors.

* * * * *